US006855590B2

(12) United States Patent
Seo et al.

(10) Patent No.: US 6,855,590 B2
(45) Date of Patent: Feb. 15, 2005

(54) METHOD OF MANUFACTURING THE SEMICONDUCTOR DEVICE INTENDED TO PREVENT A LEAKAGE CURRENT FROM OCCURING DUE TO A GATE INDUCED DRAIN LEAKAGE EFFECT

(75) Inventors: Sang-Hun Seo, Daejeon (KR); Seung-Hyun Park, Seoul (KR); Han-Sin Lee, Suwon (KR); Moo-Sung Kim, Kyungju (KR); Won-Suk Yang, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/650,089

(22) Filed: Aug. 28, 2003

(65) Prior Publication Data

US 2004/0144981 A1 Jul. 29, 2004

(30) Foreign Application Priority Data

Aug. 29, 2002 (KR) ........................................ 2002-51322

(51) Int. Cl.$^7$ ......................................... H01L 21/8238
(52) U.S. Cl. ....................... 438/199; 438/217; 438/231
(58) Field of Search ................................. 438/174, 199, 438/217, 218, 229, 230, 231, 275, 283, 289, 291, 301, 302, 303

(56) References Cited

U.S. PATENT DOCUMENTS

| 4,949,136 A | 8/1990 | Jain |
| 5,015,595 A | 5/1991 | Wollesen |
| 6,670,251 B2 * | 12/2003 | Fukada et al. ............... 438/303 |

* cited by examiner

Primary Examiner—Hoai Pham
(74) Attorney, Agent, or Firm—Lee & Sterba, P.C.

(57) ABSTRACT

A CMOS semiconductor device and a method of manufacturing the same in which the gate induced drain leakage (GIDL) effect is reduced. In the semiconductor device of this invention, high concentration source/drain regions of a PMOS transistor are formed away from the gate pattern sidewall spacers. This is accomplished by using as an implant mask a dielectric film formed on an entire surface of a semiconductor substrate, where the semiconductor substrate includes a PMOS transistor region in an n-well, a low concentration source/drain regions of a PMOS transistor formed by using a gate pattern as an implant mask, the PMOS transistor gate pattern sidewall spacers, and an NMOS transistor region in a p-well with the NMOS transistor having both a low concentration and a high concentration source/drain regions.

11 Claims, 8 Drawing Sheets

METHOD OF MANUFACTURING THE SEMICONDUCTOR DEVICE INTENDED TO PREVENT A LEAKAGE CURRENT FROM OCCURING DUE TO A GATE INDUCED DRAIN LEAKAGE EFFECT

BACKGROUND OF THE INVENTION

1. Field of the Invention

The present invention relates in general to a semiconductor device and a method of manufacturing the same. More particularly, the present invention is directed to an enhancement mode MOSFET device and methods of manufacturing the same.

2. Description of the Related Art

Increasing the density of integration of a semiconductor device requires shortening of channel length of MOS transistors. If the channel length of the MOS transistor is shortened, a significant leakage current flows even though a voltage lower than a threshold voltage is applied to a gate of the MOS transistor. A high leakage current flow through the semiconductor device made of the MOS transistors, in the stand-by condition, leads to a high power consumption. Several methods, such as reducing the thickness of a gate dielectric layer or increasing the channel ion implantation concentration etc, have been tried for solving this short channel effect problem of the MOS transistor.

However, these conventional methods also cause a change in the threshold voltage of the MOS transistor, making it difficult to optimize the thickness of the gate dielectric layer and the channel ion implantation concentration. Therefore, an attempt to solve the short channel effect through a lightly doped drain/source (LDD) structure is underway instead of the above stated approaches.

The MOS transistor having the conventional LDD structure has a large overlap area between the source/drain and the gate, and consequently a large overlap capacitance. The conventional LDD structure also introduces a significant leakage current in the MOS transistor by a gate induced drain leakage (GIDL) effect. In the GIDL effect, a tunneling current is generated between the drain region and its adjacent channel region even when the MOS transistor is in 'Off' state. Such a large leakage current may cause an error operation of a PMOS transistor.

SUMMARY OF THE INVENTION

The present invention is directed to an enhancement mode MOSFET based semiconductor device and a method of manufacturing the semiconductor device intended to prevent a leakage current from occurring due to a GIDL (Gate induced drain leakage) effect.

According to an embodiment of the present invention, there is provided a semiconductor device manufacturing method, which may prevent the leakage current from occurring due to the GIDL effect, comprising the steps of forming a first dielectric film on an entire upper part of a semiconductor substrate, forming a photoresist pattern on a p-well including a gate pattern of an NMOS transistor and a gate spacer thereof, and subsequently implanting ions into an n-well for forming a high concentration source/drain regions of a PMOS by using the first dielectric film formed on upper parts of a gate pattern and a gate spacer of a PMOS transistor as an implant mask, and forming an interlayer dielectric film thereon and then forming a contact, wherein said semiconductor substrate includes a PMOS transistor region in the n-well; an NMOS transistor region in the p-well, the gate pattern of the PMOS transistor formed on the PMOS transistor region and the gate spacers formed on both side walls of the gate pattern thereof, and the gate pattern of the NMOS transistor formed on the NMOS transistor region and the gate spacers formed on both side walls of the gate pattern thereof, the n-well having a low concentration source/drain regions formed by ion-implantation using the gate pattern of the PMOS transistor as an implant mask, and the p-well having a low concentration source/drain regions formed by ion-implantation using the gate pattern of the NMOS transistor as an implant mask and a high concentration source/drain regions formed by ion-implantation using the gate pattern and the gate spacers of the NMOS transistor as an implant mask.

According to another embodiment of the present invention, there is provided a semiconductor device manufacturing method comprising the step of forming a high concentration source/drain regions of a PMOS transistor by an ion-implantation using a dielectric film formed on an entire upper part of a semiconductor substrate as an implant mask, wherein the semiconductor substrate includes a PMOS transistor region in which a low concentration source/drain regions are ion-implanted into an n-well by using a gate pattern as an implant mask; and an NMOS transistor region, in which a low concentration source/drain regions are formed by an ion-implantation using a gate pattern of the NMOS transistor as an implant mask and a high concentration source/drain regions formed by ion-implantation using the gate pattern and gate spacers of the NMOS transistor as an implant mask.

According to yet another embodiment of the present invention, there is provided a semiconductor device manufacturing method comprising the steps of forming a metal film on upper parts of a gate pattern of a PMOS transistor and a gate pattern of an NMOS transistor on a semiconductor substrate, and then forming a capping layer entirely over the semiconductor substrate including the gate patterns and gate spacers of the NMOS and PMOS transistors for performing a silicidation process and forming a silicide film on the upper parts of the gate patterns of the PMOS and NMOS transistors; forming a photoresist pattern on a p-well including the gate pattern of the NMOS transistor and a gate spacer, and subsequently implanting ions into an n-well for forming a high concentration source/drain regions by using as an implant mask the capping layer formed on the upper parts of the gate pattern and a gate spacer of the PMOS transistor; and forming an interlayer dielectric film thereon and then forming a contact, wherein said semiconductor substrate includes a PMOS transistor region in the n-well; an NMOS transistor region in the p-well, the gate pattern of the PMOS transistor formed on the PMOS transistor region and the gate spacers formed on both side walls of the gate pattern thereof, and the gate pattern of the NMOS transistor formed on the NMOS transistor region and the gate spacers formed on both side walls of the gate pattern thereof, the n-well having a low concentration source/drain regions formed by ion-implantation using the gate pattern of the PMOS transistor as an implant mask; and the p-well having a low concentration source/drain regions formed by ion-implantation using the gate pattern of the NMOS transistor as an implant mask and a high concentration source/drain regions formed by ion-implantation using the gate pattern and the gate spacers of the NMOS transistor as an implant mask.

According to a feature of the present invention, the first dielectric film or the capping layer may be an etch stopper in forming a contact hole as well as the implant mask in forming the high concentration source/drain regions of the PMOS transistor.

According to another feature of the present invention, the first dielectric film or the capping layer thickness may be about 1000 Angstroms and may be made of any one of SiN and SiON, and the metal film formed on top of the gate pattern may be made of cobalt.

According to yet another feature of the present invention, there is provided a semiconductor device comprising a semiconductor substrate having a uniform conductivity, a PMOS transistor that includes a gate pattern composed of a gate oxide film and a gate conductive layer on a PMOS transistor region of the semiconductor substrate, ion-implanted low concentration source/drain regions formed on both sides of the gate pattern on the semiconductor substrate, and ion-implanted high concentration source/drain regions also formed on both sides of the gate pattern but at a distance far from the gate pattern; and an NMOS transistor that includes a gate pattern composed of a gate oxide film and a gate conductive layer on an NMOS transistor region of the semiconductor substrate, ion-implanted low concentration source/drain regions formed on both sides of the gate pattern on the semiconductor substrate, and ion-implanted high concentration source/drain regions also formed on both sides of the gate pattern but at a distance relatively nearer to the gate pattern compared to the distance between the high concentration source/drain regions and the gate pattern of the PMOS transistor.

According to still another feature of the present invention, there is provided a semiconductor device comprising a semiconductor substrate having a uniform conductivity; and a PMOS transistor that includes a gate pattern composed of a gate oxide film and a gate conductive layer on a PMOS transistor region of the semiconductor substrate, a gate spacer on both sidewalls of the gate spacer, ion-implanted low concentration source/drain regions formed on both sides of the gate pattern in the semiconductor substrate, and ion-implanted high concentration source/drain regions also formed on both sides of the gate pattern but away from the gate spacer.

According to another feature of the present invention, there is provided a semiconductor device manufacturing method comprising the steps of forming a first dielectric film on an entire upper part of a semiconductor substrate that includes a PMOS transistor region, a gate pattern of a PMOS transistor formed on the PMOS transistor region, an n-well having ion-implanted low concentration source/drain regions formed by using the gate pattern of the PMOS transistor as an implant mask, and spacers formed on both side walls of the gate pattern, implanting ions for forming a high concentration source/drain regions into the n-well by using as an implant mask the first dielectric film formed on upper parts of the gate pattern of the PMOS transistor and the gate spacers, and forming an interlayer dielectric film thereon, and subsequently forming a contact.

According to yet another feature of the present invention, there is provided a semiconductor device characterized by a low concentration source/drain regions formed by using a gate pattern as an implant mask, a dielectric film formed on an entire upper part of a semiconductor substrate on which gate spacers are formed on both side walls of the gate pattern, and high concentration source/drain regions formed by using the dielectric film as an implant mask.

BRIEF DESCRIPTION OF THE DRAWINGS

The above and other embodiments, features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-51322, filed on Aug. 29, 2002, and entitled: "Semiconductor Device and Method of Manufacturing the Same", is incorporated herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Hereinafter, preferred embodiments of the present invention will be described in detail with reference to the accompanying drawings.

Referring to FIGS. 1 to 7, there is illustrated a process sequence of a single gate type semiconductor device and a method of manufacturing the same according to an exemplary embodiment of the present invention. Referring to FIGS. 8 to 15, there is illustrated a process sequence of a dual gate type semiconductor device and a method of manufacturing the same according to another exemplary embodiment of the present invention.

Figure 1:
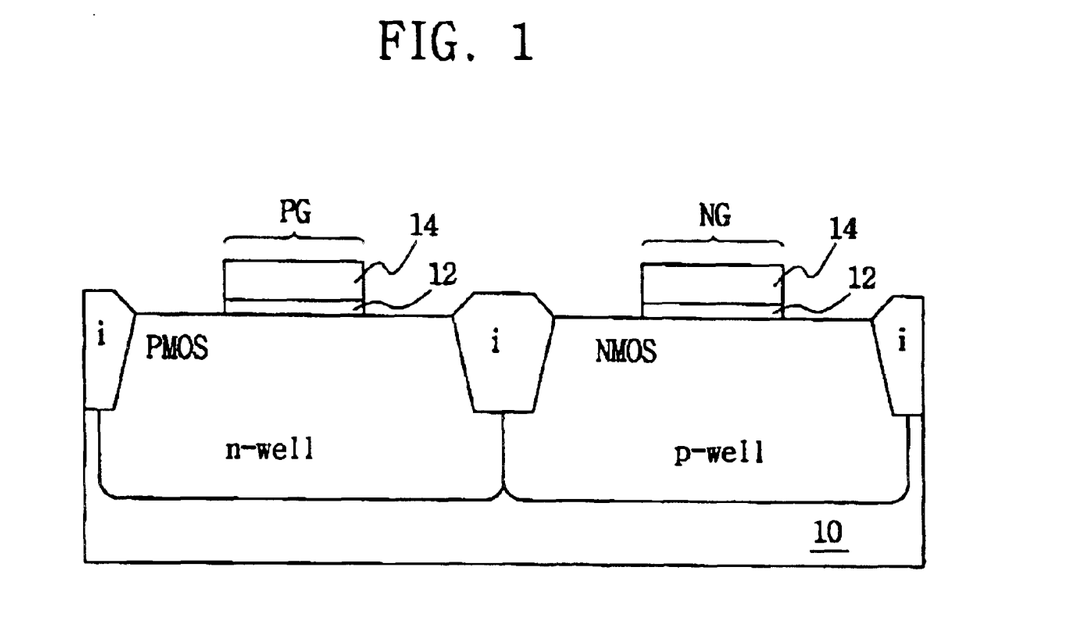
FIGS. 1 to 7 illustrate a process sequence of a single-gate type semiconductor device and a method of fabricating the same in accordance with one exemplary embodiment of the present invention.

Referring first to FIG. 1 of FIGS. 1 through 7 showing one embodiment of the single-gate type semiconductor device, an isolation layer (i) is formed on a field region of a p-type semiconductor substrate 10 to electrically isolate an active region intended for a PMOS transistor from an active region intended for an NMOS transistor. An n-well is formed in the active region intended for the PMOS transistor, and a p-well is formed in the active region intended for the NMOS transistor. On such formed p-type semiconductor substrate 10, a gate oxide film 12 is formed, and then on top of the gate oxide film 12, a gate conductive layer 14 is formed. Then a gate pattern PG of the PMOS transistor and a gate pattern NG of the NMOS transistor are formed using a photolithography process.

Figure 2:
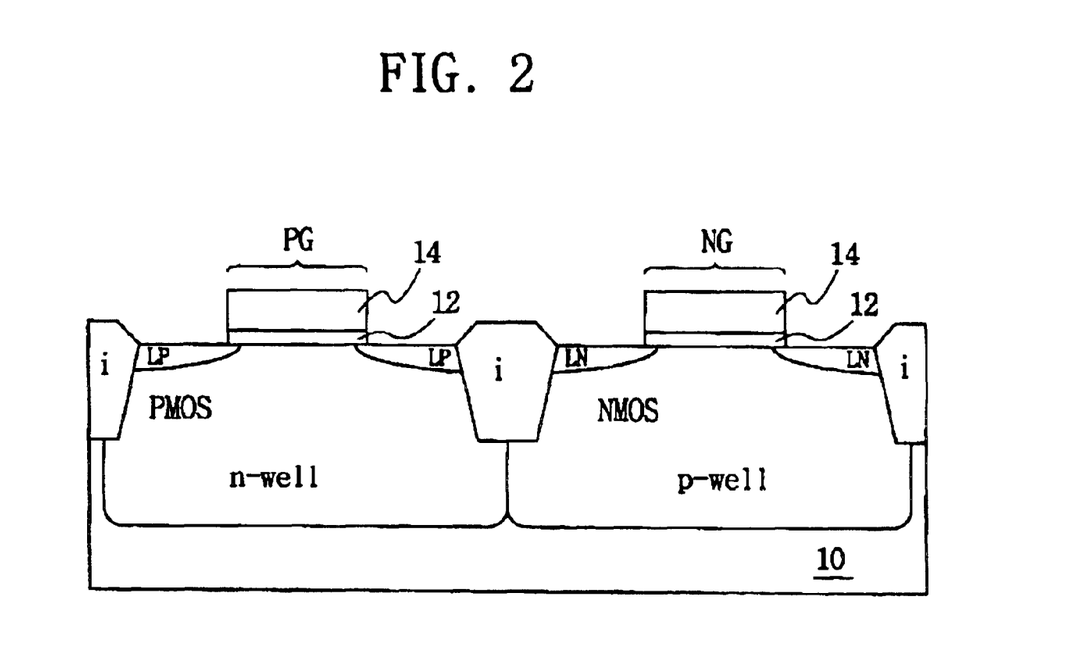

Referring to FIG. 2, a first photoresist pattern PR1 (not shown) is formed on the P-well including the gate pattern NG of the NMOS transistor, exposing the n-well including the gate pattern PG of the PMOS transistor. Next, ion implantation regions LP, which are low concentration source/drain regions, are formed by implanting ions of a low concentration into the n-well by using the gate pattern PG of the PMOS transistor as a mask. Then the first photoresist pattern PR1 (not shown) is removed, and next a second photoresist pattern PR2 (not shown) is formed on the n-well including the gate pattern PG of the PMOS transistor, exposing the p-well including the gate pattern NG. Also, ions of a low concentration are implanted into the p-well by using the gate pattern NG of the NMOS transistor as a mask. This ion-implantation processing step forms low concentration source/drain regions LN of the NMOS transistor.

Figure 3:
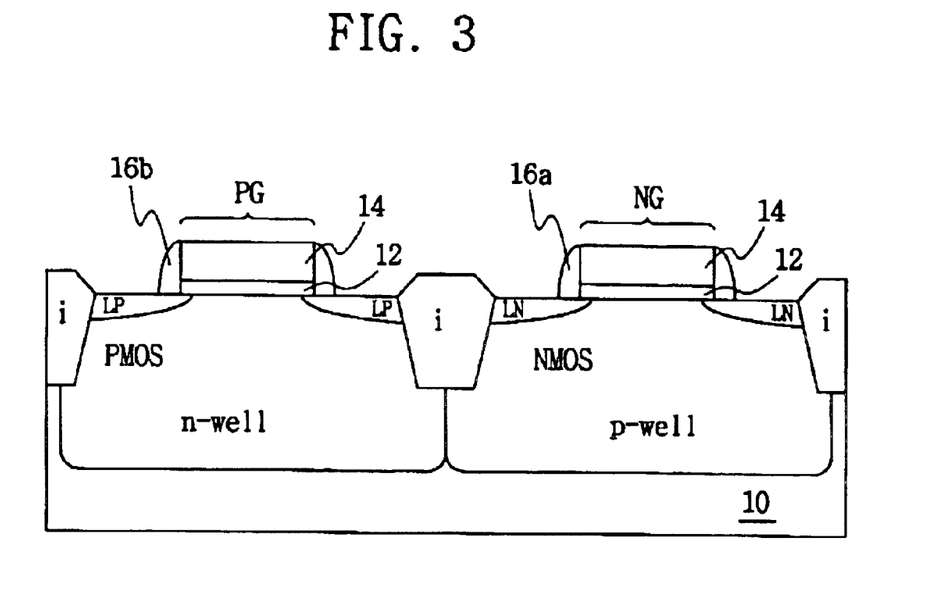

Referring to FIG. 3, the second photoresist pattern PR2 (not shown) is removed, and then on an entire upper surface of such formed P-type semiconductor substrate 10, a first dielectric film is formed and subsequently etched by a photolithography process, to form gate spacers 16b and gate spacers 16a on both side walls of the gate patterns PG and NG.

Figure 4:
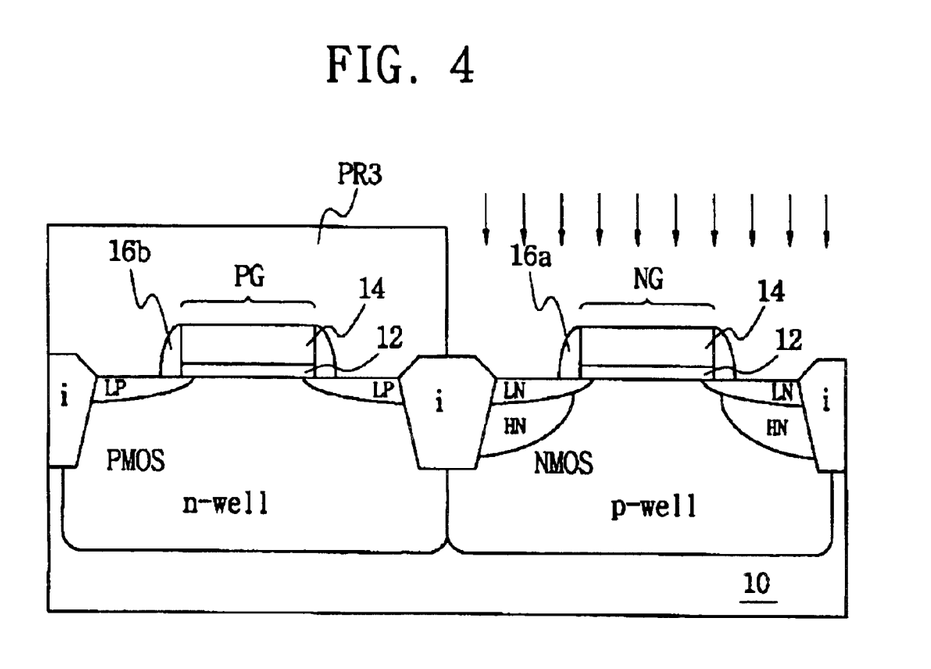

Referring to FIG. 4, a third photoresist pattern PR3 is formed on the n-well including the gate pattern PG and the gate spacers 16b using a photolithography process, there by exposing the p-well including the gate pattern NG. Next, ions of a high concentration are implanted into the p-well by using the gate pattern NG and the gate spacers 16a together as a mask, so as to form a high concentration source/drain regions HN of the NMOS transistor.

Figure 5:
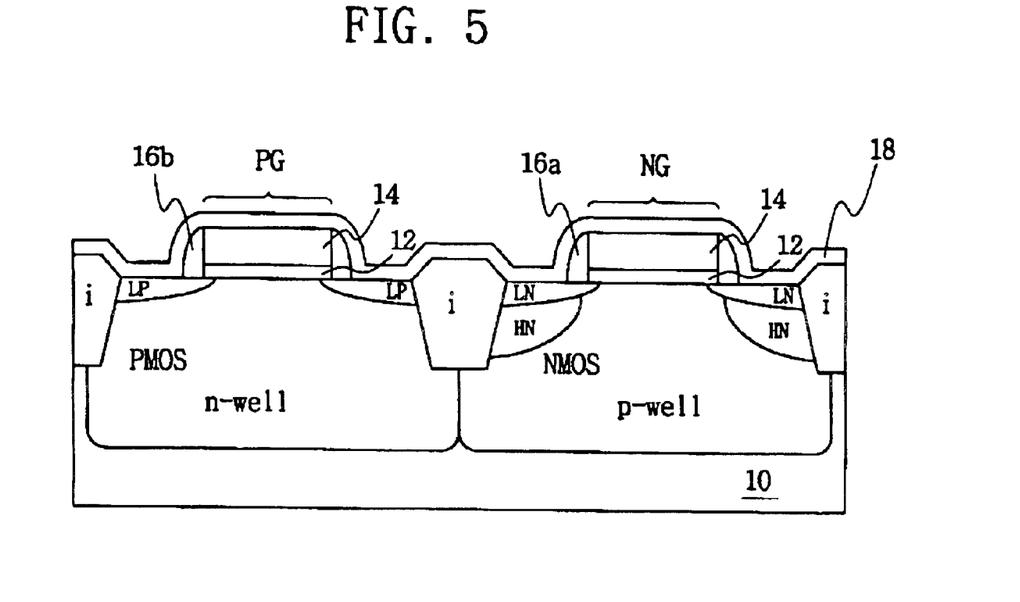

Referring to FIG. 5, subsequently, the third photoresist pattern PR3 is removed, and then a second dielectric film 18, may be made of SiN or SiON, is formed over an entire surface of such formed p-type semiconductor substrate 10. The second dielectric film 18 also may be used as an etch stopper later, while forming contact holes through an interlayer dielectric film, and is deposited to a thickness of about 1000Å. Also, the second dielectric film 18 of the present invention may be used as a mask afterward while forming the high concentration source/drain regions of the PMOS transistor.

Figure 6:
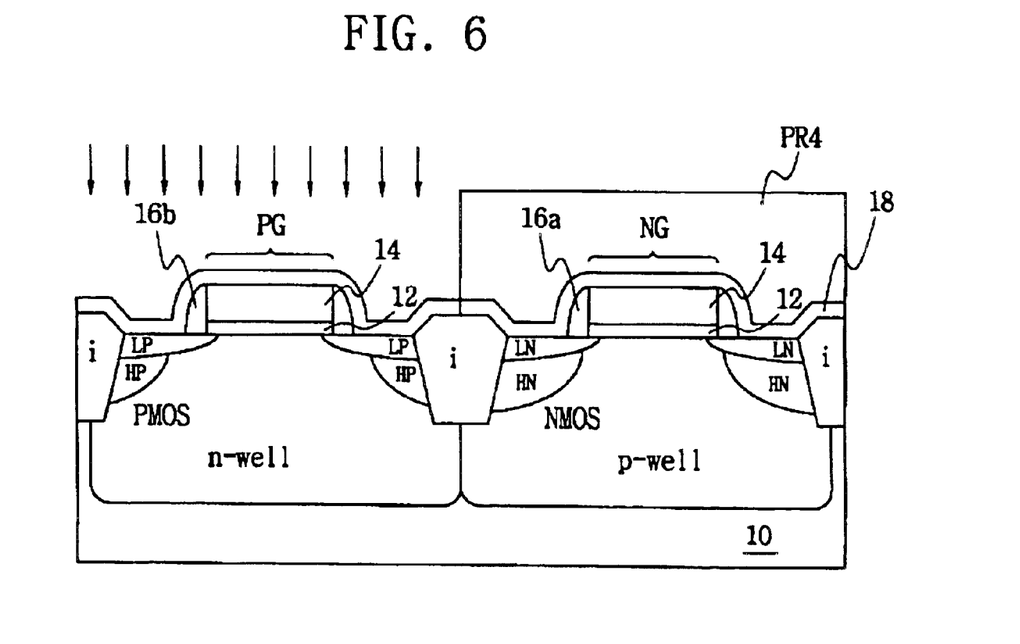

Referring to FIG. 6, a fourth photoresist pattern PR4 is formed on the p-well including the gate pattern NG and the gate spacers 16a using the photolithography process, there by exposing the n-well including the gate pattern PG and the gate spacers 16b. The process of forming the fourth photoresist pattern PR4 may be similar to that of the third photoresist pattern PR3. Subsequently, ions of a high concentration are implanted into the p-well, by using the second dielectric film 18 formed on the upper surface of the gate pattern PG and on the gate spacers 16b as a mask, so as to form high concentration source/drain regions HP of the PMOS transistor. Thus, high concentration source/drain regions HP, formed by using the second dielectric film 18 as an implant mask, reduce an overlap between the gate and the drain regions and consequently decrease a leakage current caused by the GIDL effect.

Figure 7:
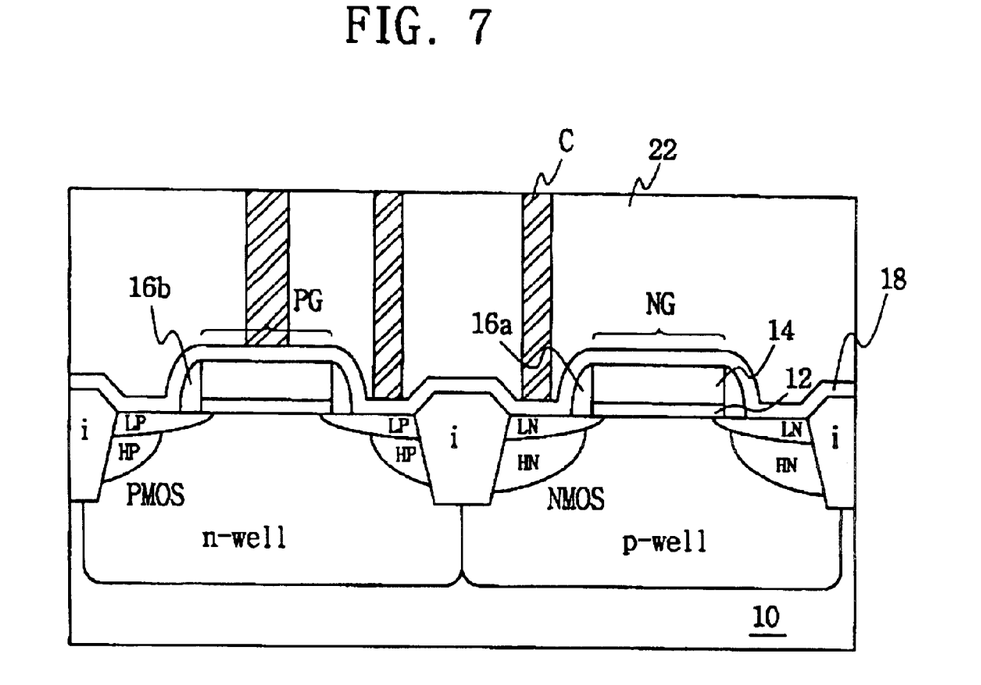
Figure 8:
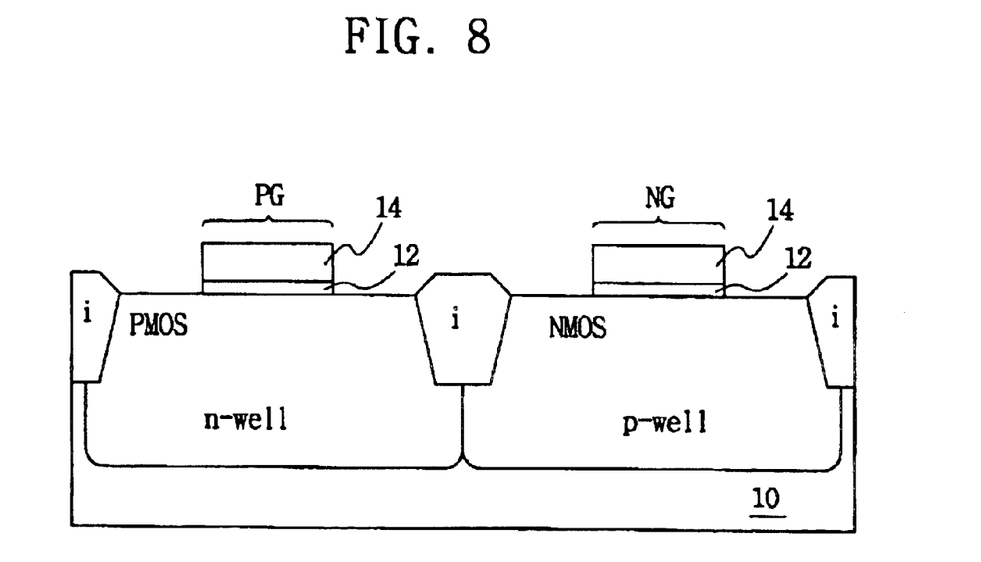
FIGS. 8 to 15 illustrate a process sequence of a dual-gate type semiconductor device and a method of fabricating the same in accordance with another exemplary embodiment of the present invention.
Figure 9:
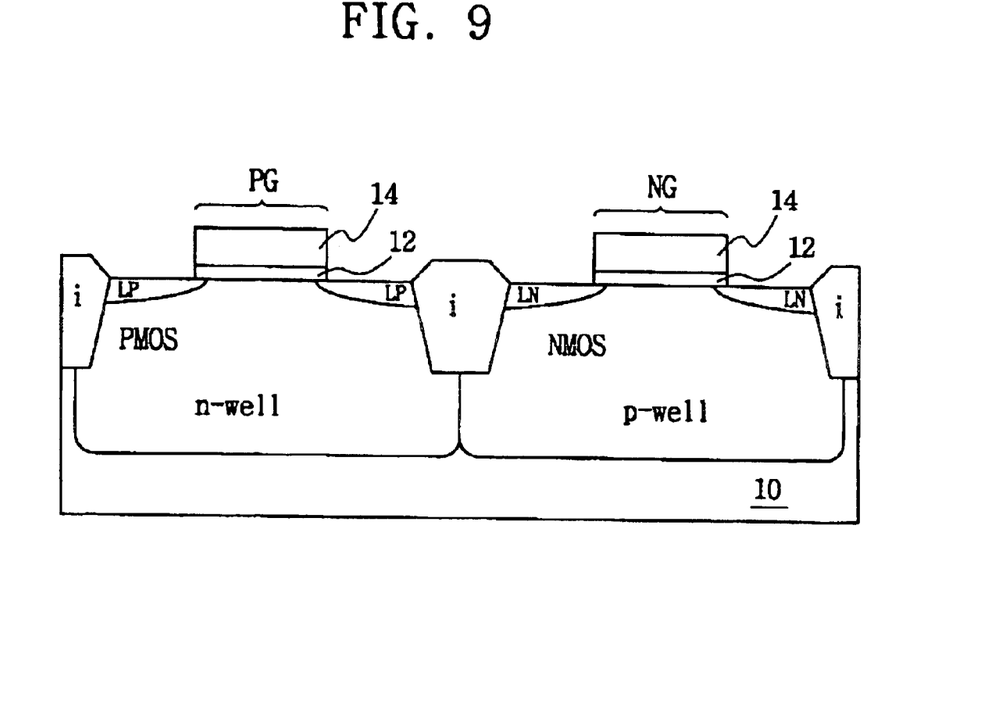
Figure 10:
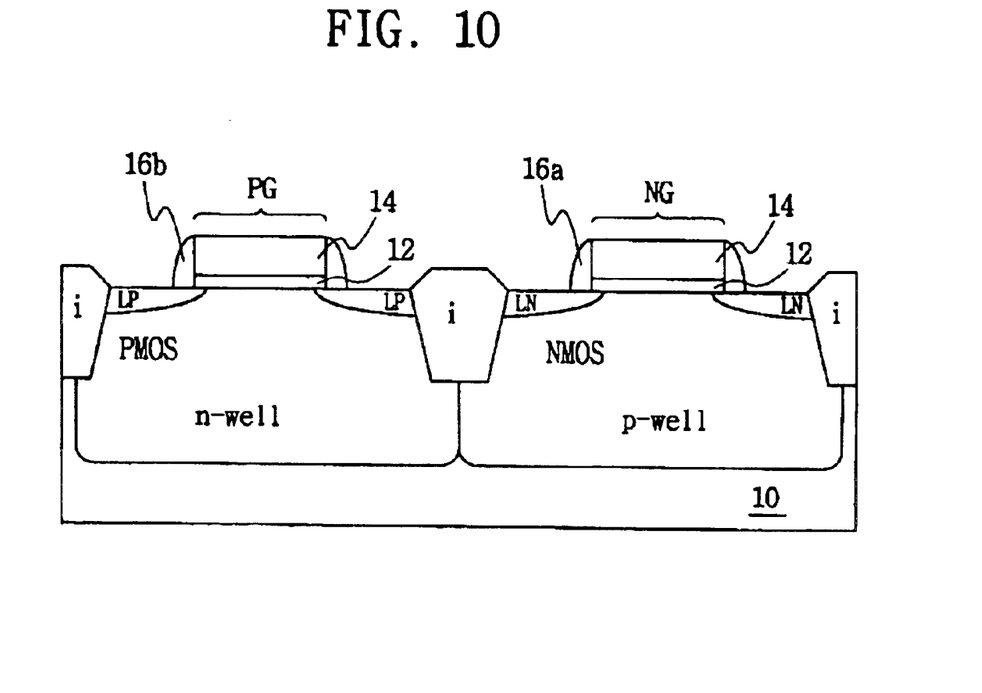
Figure 11:
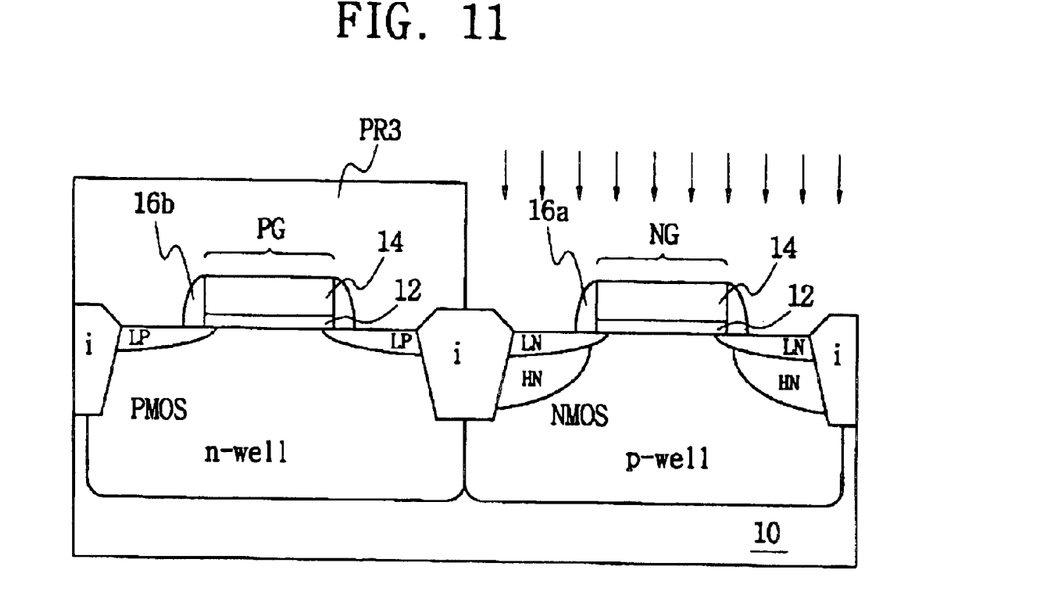

Referring to FIG. 7, subsequently, the fourth photoresist pattern PR4 is removed and then an interlayer dielectric film 22 is deposited over an entire surface of such formed p-type semiconductor substrate 10. Next contact holes are formed using a photolithography process, and then the contact holes are filled with a metal so as to form a contact plug (C). Etching of the second dielectric film 18 in the contact hole area may be performed (not shown) before depositing the contact plug (C) material. Thereby the process of fabricating the single-gate type CMOS transistor, which is provided with a lightly doped drain/source (LDD) structure, is completed.

Accordingly, in this embodiment of the present invention referring to FIGS. 1 through 7, the high concentration source/drain regions HP of the PMOS transistor in a CMOS device are formed, by using the second dielectric film as an implant mask. The high concentration source/drain regions HP of the PMOS transistor, thus formed, reduce an overlap between the gate and the drain regions and consequently decrease a leakage current caused by the GIDL effect.

Referring to FIGS. 8 to 15, there is illustrated a process sequence of a double-gate type semiconductor device and a method of fabricating the same, according to another exemplary embodiment of the present invention.

FIGS. 8 through 11 have the same sequential steps as FIGS. 1 to 4. That is, an isolation layer (i) is formed on a field region of a p-type semiconductor substrate to electrically isolate a PMOS transistor active region from an NMOS transistor active region. An n-well is formed in the PMOS transistor active region, and a p-well is formed in the NMOS transistor active region. On such a formed p-type semiconductor substrate 10, a gate oxide film 12 is formed, and on an upper surface of the gate oxide film 12, a gate conductive layer 14 is formed, then gate patterns PG and PN of a PMOS transistor and an NMOS transistor, respectively are formed by a photolithography process.

A first photoresist pattern PR1 (not shown) is formed on the p-well including the gate pattern NG of the NMOS transistor, and ions of a low concentration are implanted into the n-well by using the gate pattern PG of the PMOS transistor as a mask, to form low concentration source/drain regions LP of the PMOS transistor. Also, the second photoresist pattern PR2 (not shown) is formed on the n-well including the gate pattern PG of the PMOS transistor, and then ions of a low concentration are implanted into the p-well by using the gate pattern NG of the NMOS transistor as a mask, to form low concentration source/drain regions LN of the NMOS transistor. On such a formed P-type semiconductor substrate 10, a first dielectric film is formed entirely over the surface of the substrate 10, and then etched by a phototolithography process, so as to form gate spacers 16b and 16a on both side walls of the gate patterns PG and NG, respectively.

Subsequently, a third photoresist pattern PR3 is formed on the n-well including the gate pattern PG and the gate spacers 16b, using a photolithography process, thus exposing the p-well including the gate pattern NG. Then, ions of a high concentration are implanted into the p-well by using the gate pattern NG and the gate spacers 16a together as a mask, so as to form a high concentration source/drain regions HN of the NMOS transistor.

Figure 12:
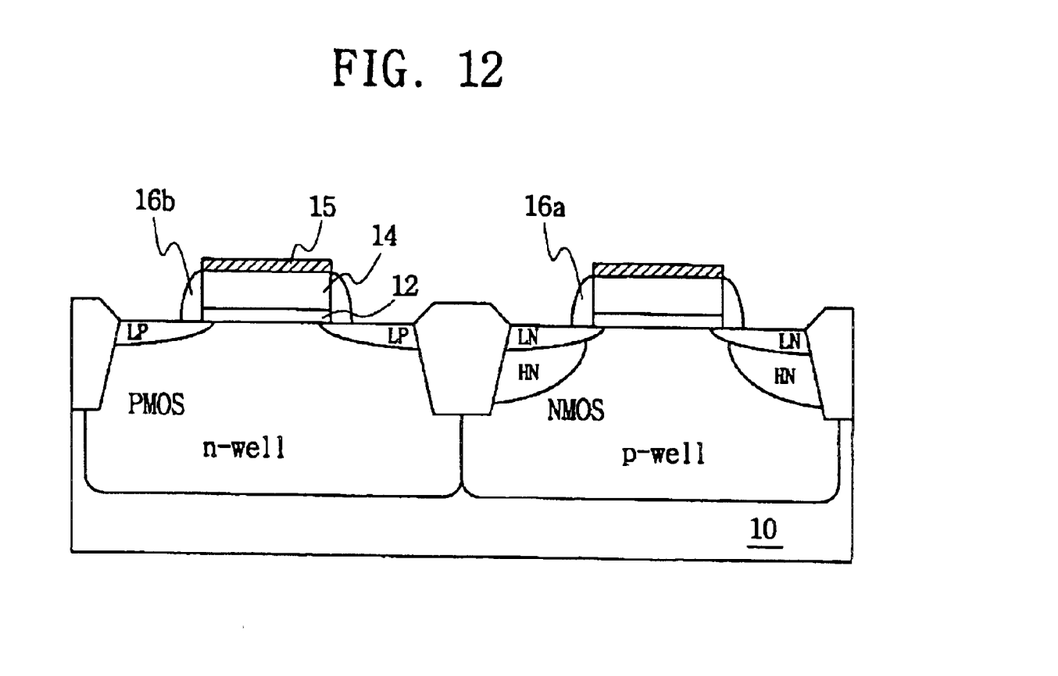

Referring to FIG. 12, the third photoresist pattern PR3 is removed, and then a metal film, e.g., a cobalt film 15, used for obtaining a silicide film is formed on the upper surface of the gate patterns, PG and NG. Additionally, before depositing the cobalt film 15, a process for removing a natural oxide film for restraining a premature silicidation can be provided.

Figure 13:
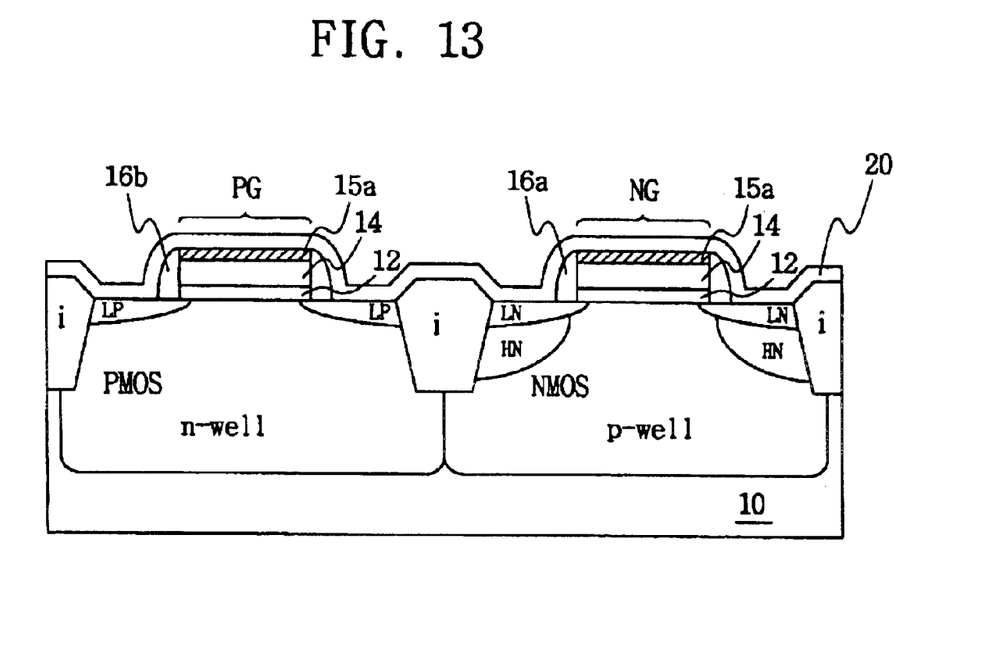

Referring to FIG. 13, a capping layer 20, made of a material such as SiON or SiN, is deposited to a thickness of about 1000Å over the entire surface of such a formed P-type substrate 10. The capping layer 20 is intended for a silicidation of the cobalt film 15. Further, the capping layer 20 of the present invention is used as an implant mask in a later process of forming the heavily doped source/drain regions of the PMOS transistor. The capping layer may also serve as an etch stopper in forming contact holes through an interlayer dielectric film. After depositing the capping layer 20, the cobalt film 15 is thermally processed for silicidation, to form a silicide film 15a. That is, elements of the capping 20 are diffused into the cobalt film during the thermal process to perform a silicidation reaction.

Figure 14:
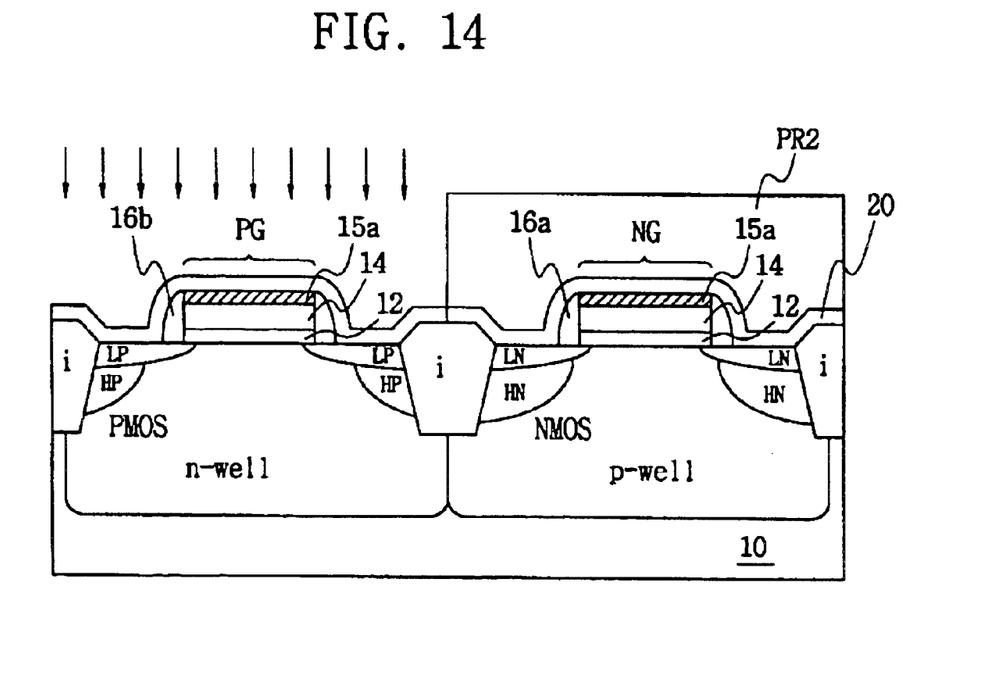

Next, referring to FIG. 14, a fourth photoresist pattern PR4 is formed on the P-well including the gate pattern NG and the gate spacers 16a using a photolithography process, thus exposing the n-well including the gate pattern PG. The process of forming the fourth photoresist pattern PR4 may be similar to that of the third photoresist pattern PR3. Subsequently, ions of a high concentration are implanted into the p-well by using the capping layer 20 formed on the upper parts of the gate pattern PG and the gate spacers 16b as a mask, to create high concentration source/drain regions HP of the PMOS transistor. Therefore, the high concentration source/drain regions HP of the PMOS transistor, formed by using the capping layer 20 as an implant mask, thus reduce an overlap between the gate and the drain regions and thereby decrease a leakage current caused by the GIDL effect.

Figure 15:
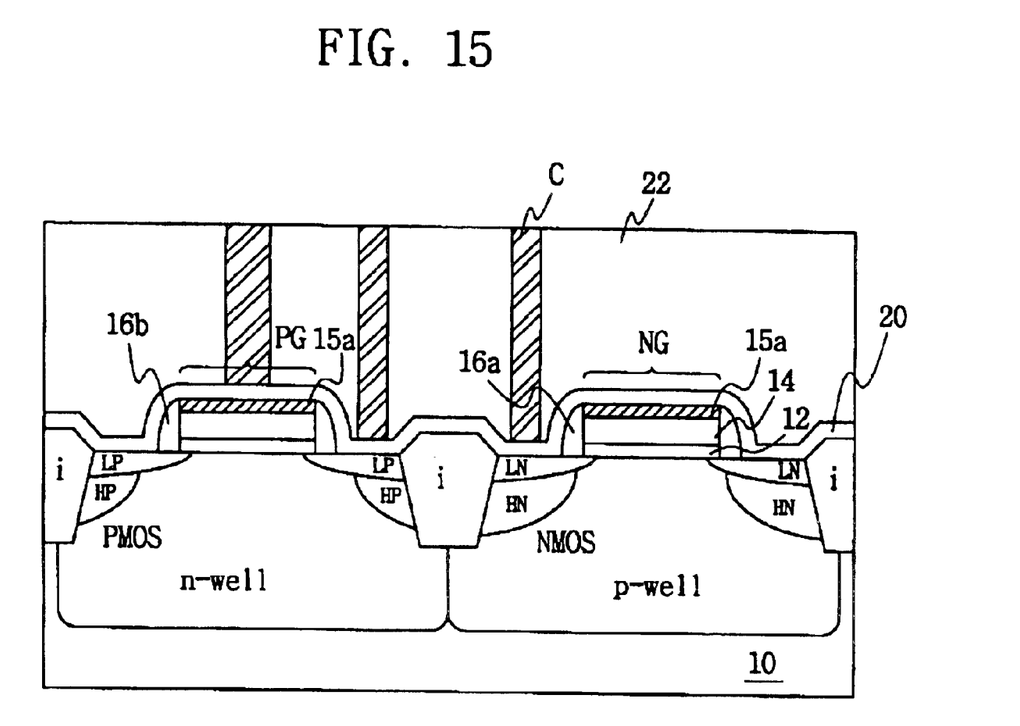

Referring to FIG. 15, the fourth photoresist pattern PR4 is removed, and entirely thereon, an interlayer dielectric film 22 is formed. Next, a contact hole is formed using a photolithography etching process, and then this contact hole is filled to form a contact plug (C). Etching of the capping layer 20 in the contact hole area may be performed (not shown) before depositing the contact plug (C) material. Thereby, the fabricating process of a dual-gate type CMOS transistor having an LDD (Lightly doped drain/source) structure is completed.

Accordingly, in this embodiment of the present invention, the high concentration source/drain regions HP of a PMOS transistor in a CMOS device are formed by using the capping layer as an implant mask, thereby reducing an overlap between the gate and the drain regions of the PMOS transistor and consequently decreasing a leakage current caused by the GIDL effect.

As described above, according to one of the embodiments of the present invention, the second dielectric film, which may be used as an etch stopper in forming the contact hole is used as an implant mask in forming the high concentration source/drain regions of the PMOS transistor in CMOS devices. In the PMOS transistor thus formed, an overlap between the gate and the drain regions is decreased and consequently the leakage current by the GIDL effect is reduced.

In addition, according to an embodiment of the current invention, high concentration source/drain regions of a PMOS transistor are formed by using the capping layer intended for a silicidation process of a gate metal film as an implant mask. In this process an overlap between the gate and the drain regions of the PMOS transistors is reduced considerably and hence a leakage current caused by the GIDL effect is decreased.

According to an embodiment of the present invention, the high concentration source/drain regions HP of the PMOS transistor are formed farther away from the gate pattern PG compared to the high concentration source/drain regions HN of the NMOS transistor to the gate pattern NG.

According to an embodiment of the present invention, the high concentration source/drain regions HP of the PMOS transistor are formed away from the gate pattern sidewall spacers.

According to another embodiment of the present invention, a semiconductor device is characterized by a low concentration source/drain regions formed by using a gate pattern as an implant mask, a dielectric film formed on an entire upper part of a semiconductor substrate on which gate spacers are formed on both side walls of the gate pattern, and a high concentration source/drain regions formed by using the dielectric film as an implant mask.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and acope of the present invention as set forth in the following claims.

What is claimed is:

1. A semiconductor device manufacturing method comprising the steps of:

forming a first dielectric film on an entire upper part of a semiconductor substrate; forming a photoresist pattern on a p-well including a gate pattern of an NMOS transistor and a gate spacer thereof, and subsequently implanting ions into an n-well for forming a high concentration source/drain regions of a PMOS by using the first dielectric film formed on upper parts of a gate pattern and a gate spacer of a PMOS transistor as an implant mask; and forming an interlayer dielectric film thereon and then forming a contact, wherein said semiconductor substrate includes a PMOS transistor region in the n-well; an NMOS transistor region in the p-well; the gate pattern of the PMOS transistor formed on the PMOS transistor region and the gate spacers formed on both side walls of the gate pattern thereof, and the gate pattern of the NMOS transistor formed on the NMOS transistor region and the gate spacers formed on both side walls of the gate pattern thereof; the n-well having a low concentration source/drain regions formed by ion-implantation using the gate pattern of the PMOS transistor as an implant mask; and the p-well having a low concentration source/drain regions formed by ion-implantation using the gate pattern of the NMOS transistor as an implant mask and a high concentration source/drain regions formed by ion-implantation using the gate pattern and the gate spacers of the NMOS transistor as an implant mask.

2. The method as claimed in claim 1, wherein the first dielectric film is an etch stopper in forming a contact hole as well as the implant mask in forming the high concentration source/drain regions of the PMOS transistor.

3. The method as claimed in claim 1, wherein the first dielectric film thickness is 1000 Angstroms.

4. The method as claimed in claim 1, wherein the first dielectric film is made of any one of SiN and SiON.

5. A semiconductor device manufacturing method comprising the step of:

forming a high concentration source/drain regions of a PMOS transistor by an ion-implantation using a dielectric film formed on an entire upper part of a semiconductor substrate as an implant mask, wherein the semiconductor substrate includes a PMOS transistor region in which a low concentration source/drain regions are ion-implanted into an n-well by using a gate pattern as an implant mask; and an NMOS transistor region, in which a low concentration source/drain regions are formed by an ion-implantation using a gate pattern of the NMOS transistor as an implant mask and a high concentration source/drain regions formed by ion-implantation using the gate pattern and gate spacers of the NMOS transistor as an implant mask.

6. A semiconductor device manufacturing method comprising the steps of:

forming a metal film on upper parts of a gate pattern of a PMOS transistor and a gate pattern of an NMOS transistor on a semiconductor substrate, and then forming a capping layer entirely over the semiconductor substrate including the gate patterns and gate spacers of the NMOS and PMOS transistors for performing a silicidation process and forming a silicide film on the upper parts of the gate patterns of the PMOS and NMOS transistors;

forming a photoresist pattern on a p-well including the gate pattern of the NMOS transistor and a gate spacer, and subsequently implanting ions into an n-well for forming a high concentration source/drain regions by using as an implant mask the capping layer formed on the upper parts of the gate pattern and a gate spacer of the PMOS transistor; and forming an interlayer dielectric film thereon and then forming a contact, wherein said semiconductor substrate includes a PMOS transistor region in the n-well; an NMOS transistor region in the p-well; the gate pattern of the PMOS transistor formed on the PMOS transistor region and the gate spacers formed on both side walls of the gate pattern thereof, and the gate pattern of the NMOS transistor formed on the NMOS transistor region and the gate spacers formed on both side walls of the gate pattern thereof; the n-well having a low concentration source/drain regions formed by ion-implantation using the gate pattern of the PMOS transistor as an implant mask; and the p-well having a low concentration source/drain regions formed by ion-implantation using the gate pattern of the NMOS transistor as an implant mask and a high concentration source/drain regions formed by ion-implantation using the gate pattern and the gate spacers of the NMOS transistor as an implant mask.

7. The method as claimed in claim 6, wherein the capping layer is made of any one of SiN and SiON.

8. The method as claimed in claim 6, wherein the metal film is made of cobalt.

9. The method as claimed in claim 6, wherein the capping layer thickness is 1000 Angstroms.

10. The method as claimed in claim 6, wherein the capping layer is an etch stopper in forming a contact hole.

11. A semiconductor device manufacturing method comprising the steps of:

forming a first dielectric film on an entire upper part of a semiconductor substrate that includes a PMOS transistor region, a gate pattern of a PMOS transistor formed on the PMOS transistor region, an n-well having ion-implanted low concentration source/drain regions formed by using the gate pattern of the PMOS transistor as an implant mask, and spacers formed on both side walls of the gate pattern;

implanting ions for forming a high concentration source/drain regions into the n-well by using as an implant mask the first dielectric film formed on upper parts of the gate pattern of the PMOS transistor and the gate spacers; and forming an interlayer dielectric film thereon, and subsequently forming a contact.

* * * * *